(12) United States Patent
Simonetti et al.

(10) Patent No.: US 9,575,153 B2
(45) Date of Patent: *Feb. 21, 2017

(54) MR IMAGING USING A MULTI-POINT DIXON TECHNIQUE

(75) Inventors: Arjan Willem Simonetti, Eindhoven (NL); Gwenael Henri Herigault, Geldrop (NL); Peter Boernert, Hamburg (DE)

(73) Assignee: KONINKLIJKE PHILIPS ELECTRONICS N.V., Eindhoven (NL)

(*) Notice: Subject to any disclaimer, the term of this patent is extended or adjusted under 35 U.S.C. 154(b) by 783 days.

This patent is subject to a terminal disclaimer.

(21) Appl. No.: 13/990,050

(22) PCT Filed: Nov. 24, 2011

(86) PCT No.: PCT/IB2011/055268
§ 371 (c)(1),
(2), (4) Date: May 29, 2013

(87) PCT Pub. No.: WO2012/073159
PCT Pub. Date: Jun. 7, 2012

(65) Prior Publication Data
US 2013/0249553 A1    Sep. 26, 2013

(30) Foreign Application Priority Data

Dec. 2, 2010 (EP) .................................... 10193467

(51) Int. Cl.
*G01R 33/385* (2006.01)
*G01R 33/58* (2006.01)
*G01R 33/48* (2006.01)

(52) U.S. Cl.
CPC .......... *G01R 33/583* (2013.01); *G01R 33/385* (2013.01); *G01R 33/4828* (2013.01)

(58) Field of Classification Search
USPC ... 324/300–322; 600/407–435; 382/128–131
See application file for complete search history.

(56) References Cited

U.S. PATENT DOCUMENTS 4,931,733 A   6/1990 Hanawa
5,099,207 A   3/1992 Luyten
(Continued)

OTHER PUBLICATIONS

Glover, Gary H. "Multipoint Dixon Technique for Water and Fat Proton and Susceptibility Imaging", Journal of Magnetic Resonance Imaging, Society for Magnetic Resonance Imaging, vol. 1, Jan. 1991, pp. 521-530.
(Continued)

*Primary Examiner* — Melissa Koval
*Assistant Examiner* — Tiffany Fetzner

(57) ABSTRACT

At least a portion of a body (10) of a patient positioned in an examination volume of a MR device (1). A portion of the body (10) is subject to a calibration sequence including RF pulses and switched magnetic field gradients controlled in such a manner that a calibration signal data set is acquired by a multi-point Dixon technique at a first image resolution. Calibration parameters are derived from the calibration signal data set. The MR device (1) is controlled according to the derived calibration parameters. The portion of the body (10) is subject to an imaging sequence including RF pulses and switched magnetic field gradients controlled in such a manner that a diagnostic signal data set is acquired at a second image resolution which is higher than the first image resolution. A diagnostic MR image is reconstructed from the diagnostic signal data set.

14 Claims, 2 Drawing Sheets

(56) References Cited

U.S. PATENT DOCUMENTS

| | | | |
|---|---|---|---|
| 5,309,102 A | 5/1994 | Deckard | |
| 5,617,028 A | 4/1997 | Meyer | |
| 6,064,208 A | 5/2000 | Steckner | |
| 6,509,735 B2 | 1/2003 | Mueller | |
| 6,529,002 B1 | 3/2003 | Kim | |
| 7,116,106 B1 | 10/2006 | Wolf | |
| 7,199,585 B2 | 4/2007 | Kruiskamp | |
| 8,138,759 B2 * | 3/2012 | Greiser | G01R 33/3875 324/309 |
| 2005/0264288 A1 | 12/2005 | Campagna | |
| 2006/0164082 A1 | 7/2006 | Foxall | |
| 2007/0182410 A1 | 8/2007 | Niemi | |
| 2007/0276220 A1 | 11/2007 | Harvey et al. | |
| 2008/0258725 A1 | 10/2008 | Hetherington | |
| 2010/0052674 A1 | 3/2010 | Jellus | |
| 2010/0127702 A1 | 5/2010 | Greiser | |
| 2012/0001633 A1 | 1/2012 | Fuderer et al. | |
| 2012/0092014 A1 * | 4/2012 | Castillo | G01R 33/3875 324/318 |
| 2012/0249137 A1 * | 10/2012 | Witschey | G01R 33/3875 324/309 |
| 2013/0249553 A1 * | 9/2013 | Simonetti | G01R 33/4828 324/309 |
| 2013/0249554 A1 * | 9/2013 | Simonetti | G01R 33/4828 324/309 |
| 2016/0124064 A1 * | 5/2016 | de Weerdt | G01R 33/4828 324/309 |

OTHER PUBLICATIONS

Mckenzie, C.A. et al "Abdominal Three Point Imaging with Self Calibrating Parallel MRI", International Society for Magnetic Resonance in Medicine. vol. 11, May 2004, p. 917.

Kellman, P. et al "Improved Cardiac Shim using Field Map Estimate from Multi-Echo Dixon Method", Proc. International Society for Magnetic Resonance in Medicine, vol. 17, Jan. 2009, p. 4522.

Hernando, D. et al "Joint Estimation of Water/Fat Images and Field Inhomogeneity Map", Magnetic Resonance in Medicine, vol. 59, No. 3, Mar. 2008, pp. 571-580.

Siero, J.C. et al "Cost Function Guided Image Based Bo Shimming at 3T for Efficient Fat Suppression in Liver and Prostate Imaging", Joint Annual Meeting ISMRM-ESMRMB, International Society for Magnetic Resonance in Medicine, May 2010, pp. 2589.

Eggers, Holger et al "Dual-Echo Dixon Imaging with Flexible Choice of Echo Times", Magnetic Resonance in Medicine, vol. 65, No. 1, Sep. 2011, pp. 96-107.

Pruessmann, Klaas P. et al "Sense: Sensitivity Encoding for Fast MRI", Magnetic Resonance in Medicine, vol. 42, 1999, pp. 952-962.

Sodickson, Daniel K. et al "Simultaneous Acquisition of Spatial Harmonics (SMASH): Fast Imaging with Radiofrequency Coil Arrays", Magnetic Resonance in Medicine, vol. 38, 1997, pp. 591-603.

Boernert, Peter et al "Whole Body 3D Water/Fat Resolved Continuously Moving Table Imaging", Journal of Magnetic Resonance Imaging, vol. 25, 2007, pp. 660-665.

* cited by examiner

MR IMAGING USING A MULTI-POINT DIXON TECHNIQUE

CROSS-REFERENCE TO PRIOR APPLICATIONS

This application is the U.S. National Phase application under 35 U.S.C. §371 of International Application No. PCT/IB2011/055268, filed on Nov. 24, 2011, which claims the benefit of European Patent Application No. 10193467.7, filed on Dec. 2, 2010. These applications are hereby incorporated by reference herein.

FIELD OF THE INVENTION

The invention relates to the field of magnetic resonance (MR) imaging. It concerns a method of MR imaging of at least a portion of a body of a patient positioned in an examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to an MR image by means of Fourier transformation.

With increasing field strength, the off-resonance effects caused by $B_0$ inhomogeneities become more severe and affect all MR applications. Conventional $B_0$ shimming methods focus either on a local volume or on a global volume of $B_0$ inhomogeneities. However, there are MR applications which demand globally constrained $B_0$ offsets, for example for frequency-selective fat suppression, throughout the field of view (FOV), but also require locally optimal $B_0$ homogeneity in a region of interest (ROI). An optimal shimming solution for a specific MR application can be achieved by exploiting the higher order shimming coils available in high field MR systems. J. C. Siero et al. (ISMRM $16^{th}$ Scientific Meeting 2010 Proceedings, p. 2589) have proposed a cost function guided shimming approach that is used at a $B_0$ field of 3 Tesla for efficient fat suppression in liver and prostate. According to this approach, a trade-off is sought between global and local field homogeneity for the purpose of finding a balance between effective fat suppression and local geometrical distortions. A drawback of this known approach is that no analysis of the target anatomy with regard to the distribution of fat tissue is performed. The known approach differentiates only between the local region of interest and the remaining global field of view. For this reason, no optimal $B_0$ homogeneity is achieved in the regions containing fat tissue in all cases. The US-patent application US2008/0258725 shows a multi-point B0 mapping method combined with Dixon imaging to provide automatic shimming.

SUMMARY OF THE INVENTION

From the foregoing it is readily appreciated that there is a need for an improved MR imaging technique. It is consequently an object of the invention to provide a method that enables to increase image quality, notably by achieving a better fat suppression.

In accordance with the invention, a method of MR imaging of at least a portion of a body of a patient positioned in an examination volume of a MR device is disclosed. The method comprises the steps of:

subjecting the portion of the body to a calibration sequence comprising RF pulses and switched magnetic field gradients controlled in such a manner that a calibration signal data set is acquired by means of a multi-point Dixon technique at a first image resolution;

deriving calibration parameters from the calibration signal data set;

controlling the MR device according to the derived calibration parameters;

subjecting the portion of the body to an imaging sequence comprising RF pulses and switched magnetic field gradients controlled in such a manner that a diagnostic signal data set is acquired at a second image resolution which is higher than the first image resolution; and reconstructing a diagnostic MR image from the diagnostic signal data set. According to the invention, the method of the invention comprises the steps of:

reconstructing at least one water image and at least one fat image from the calibration signal data set;

identifying a water region and a fat region on the basis of the at least one water image and the at least one fat image; and determining shim settings that maximize the $B_0$ homogeneity in the water region and/or in the fat region.

According to the per se known multi-point Dixon technique, the spectral difference between fat and water spins are made use of for the purpose of separating MR signals emanating from water containing tissue and MR signals emanating from fat tissue. In multi-point Dixon, multiple acquisitions of k-space are repeated with different echo times. The simplest Dixon technique, 2-point Dixon, acquires two complete k-space data sets, wherein the fat magnetization in the second acquisition is out of phase relative to the first acquisition at the respective echo times. Separate and distinct water and fat images are obtained by simple addition or a subtraction of the complex MR signal data sets. However, the original 2-point Dixon technique fails, when $B_0$ field inhomogeneities become larger. This is the case for many clinical applications at high $B_0$ fields where global shimming algorithms cannot completely compensate for local field variations. Higher order Dixon techniques such as 3-point Dixon or 4-point Dixon were developed to correct for these field inhomogeneities. In general, a $B_0$ field map, a water image and a fat image is obtained by means of a multi-point Dixon sequence.

According to the invention, a multi-point Dixon sequence is applied during a low-resolution calibration scan prior to the acquisition of the actual diagnostic image. The advantage is that $B_0$ mapping using multi-point Dixon is very fast and provides useful information regarding the water and fat distribution within the field of view in addition to the $B_0$ map that can be exploited for example for deriving shim settings as calibration parameters.

A low-resolution MR image, i.e. an image that is acquired at the first image resolution within the meaning of the invention, is an image, which is, due to the large voxel volume of 10-1000 mm$^3$, not usable for diagnostic purposes. A high-resolution MR image, i.e. a MR image that is acquired at the second image resolution within the meaning of the present invention, is used to answer the respective diagnostic question. The voxel volume of the diagnostic MR image is 10 mm$^3$ or less. Because of the difference in voxel volume, the calibration signal data set can be acquired much faster than the diagnostic signal data set.

Recently, techniques for accelerating MR acquisition have been developed which are called parallel acquisition. Methods in this category are SENSE (Pruessmann et al., "SENSE: Sensitivity Encoding for Fast MRI", Magnetic Resonance in Medicine 1999, 42 (5), 1952-1962) and SMASH (Sodickson et al., "Simultaneous acquisition of spatial harmonics (SMASH): Fast imaging with radio frequency coil arrays", Magnetic Resonance in Medicine 1997, 38, 591-603). SENSE and SMASH use undersampled k-space data acquisition obtained from multiple RF receiving coils in parallel. In these methods, the (complex) signal data from the multiple coils are combined with complex weightings in such a way as to suppress undersampling artifacts (aliasing) in the finally reconstructed MR images. This type of complex array combining is sometimes referred to as spatial filtering, and includes combining which is performed in the k-space domain (as in SMASH) or in the image domain (as in SENSE), as well as methods which are hybrids. In either SENSE or SMASH, it is essential to know the proper weightings or sensitivities of the coils with high accuracy. To obtain the coil sensitivities, i.e. the spatial sensitivity profiles of the array RF coils used for signal detection, a calibration pre-scan is typically performed prior to and/or after the actual image acquisition. In the pre-scan, which is also sometimes referred to as reference scan, the MR signals are usually acquired at a resolution which is significantly lower than the resolution required for the final diagnostic MR image. The low-resolution reference scan consists of an interleaving of signal acquisition via the array RF coils and via a reference coil, usually a volume coil, for example the quadrature body coil of the MR apparatus. Low resolution MR images are reconstructed from the MR signals received via the array RF coils and via the volume RF coil. The coil sensitivities, i.e. the spatial sensitivity profiles of the array RF coils, are then computed by division of the array coil images by the volume coil image.

One aspect of the invention is to use the calibration signal data set as a reference data set in parallel imaging, i.e. for determining the spatial sensitivity profiles of the array RF coils.

It is an essential idea of the present invention to expand the scope of the calibration scan to improve the workflow in parallel MR imaging. According to a preferred embodiment, the method of the invention comprises at least one of the steps of:

performing scan planning, patient anatomy identification, and/or automated patient repositioning on the basis of at least one low-resolution MR image reconstructed from the calibration signal data set;

performing fitting of a body model to at least one low-resolution MR image reconstructed from the calibration signal data set.

The three-dimensional low-resolution MR image reconstructed from the calibration signal data set can be used for coarse scan planning. To this end, the low-resolution MR image can be presented to the operator of the MR device who can, for example, select a region of interest. Moreover, the correct positioning of the patient within the examination volume of the MR apparatus can be checked automatically on the basis of the low-resolution MR image reconstructed from the calibration signal data set. Even the selection of a single array RF coil or of a subset from the available set of array RF coils can be performed on the basis of the calibration data. As explained above, the use of a multi-point Dixon technique for the calibration scan allows to separate water and fat regions, thereby delivering a complementary information. On this basis, for example, the reliability of body model fitting can be improved, thereby enabling automatic organ detection in MR imaging, for example. The separation of water and fat in combination with patient anatomy identification and body model fitting allows, by means of appropriate post-processing algorithms, for determining figures, such as organ masses, organ volumes, fat burden etc., that are interesting for the physician and for the diagnosis. The data obtained by means of the method of the invention can also be of interest for safety reasons, for example to exclude undesired positioning of the patient and the patient's extremities within the examination volume. The multi-point Dixon technique provides a $B_0$ map, as explained above. This can be used not only for image based $B_0$ shimming, but also for the prediction of the MR resonance frequency in subsequent scans of the respective examination. An efficient multi-point Dixon technique further allows for estimating the eddy current performance within the entire examination volume. This information can be used to improve image quality in subsequent scans of the respective examination (see Eggers et al., "Dual-echo Dixon Imaging with Flexible Choice of Echo Times", Magnetic Resonance in Medicine, 2010, published electronically in advance of print).

In a variety of MRI applications, motion of the examined object can adversely affect image quality. Acquisition of sufficient MR data for reconstruction of an image takes a finite period of time. Motion of the object to be imaged during that finite acquisition time typically results in motion artifacts in the reconstructed MR image. In conventional MRI approaches, the acquisition time can be reduced to a very small extent only, when a given resolution of the MR image is specified. In the case of medical MRI, motion artifacts can result for example from cardiac cycling, respiratory cycling, and other physiological processes, as well as from patient motion. In dynamic MRI scans, the motion of the examined object during data acquisition leads to different kinds of blurring, mispositioning and deformation artifacts. Prospective motion correction techniques such as the so-called navigator technique have been developed to overcome problems with respect to motion by prospectively adjusting the imaging parameters, which define the location and orientation of the FOV etc. within the imaging volume. In the navigator technique hereby, a MR signal data set is acquired from a localized and restricted volume (navigator volume), for example from a pencil-shaped volume that crosses the diaphragm of the examined patient. The navigator volume is placed in such a way that the position of the diaphragm can be reconstructed from the acquired MR signal data set and used for motion detection and correction of the FOV in real time. The navigator technique is primarily used for minimizing the effects of breathing motion in cardiac and abdominal exams. The method of the invention can be used advantageously to derive the positioning parameters of the navigator volume automatically as calibration parameters from the calibration signal data. It is possible, for example, to position the navigator volume automatically in the region of a moving organ or another anatomical structure that is detected in a low-resolution MR image reconstructed from the calibration signal data set.

According to yet another embodiment of the invention, the MR frequency ($F_0$) can be derived automatically as a calibration parameter from the calibration signal data set and the MR device can be controlled accordingly, for example by setting the frequency generator of the MR device to the derived frequency value. Since a $B_0$ map can be obtained from the calibration signal data acquired by means of a multi-point Dixon technique, the correct MR frequency for acquiring a diagnostic image from a specified region can be derived in a straight-forward manner. It is for example possible to automatically identify a particular organ, such as, for example, the liver, on the basis of a low-resolution MR image reconstructed from the calibration signal data set. It is then possible to determine the correct MR frequency, for example by defining an optimal box-shaped volume within the organ, from which a robust and accurate determination of the MR frequency is possible. In this way the acquisition of an optimal diagnostic MR image from the respective organ in a widely automated fashion is facilitated.

The method of the invention may further be used in combination with a MR device comprising a multi-channel transmit system. Two or more separate transmit RF antennas are used in this case for generating the RF pulses within the examination volume. The transmit RF antennas have different spatial sensitivity profiles. The calibration sequence can be adapted in a targeted manner, for example by introducing additional RF pulses in order to provoke Bloch-Siegert-shift effects, such that the strength of the transmit field ($B_1$) is encoded into the phases of the acquired MR signals of the calibration signal data set. On this basis the amplitude of the corresponding transmit field $B_1$ can be estimated. Hence, it becomes clear that the invention is applicable for deriving the spatial transmit sensitivity profiles of the transmit RF antennas as calibration parameters from the calibration signal data set.

In summary, the calibration sequence involving multi-point Dixon according to the invention advantageously allows for:

$B_0$ field mapping (for the purpose of image based shimming);

receive mapping (determination of receive sensitivities of the array RF coils);

transmit mapping (determination of the transmit sensitivities of the array RF coils);

coarse scan geometry planning;

automated patient positioning and repositioning;

automatic checking for specific patient safety issues (patient positioning in the examination volume);

determination of patient specific parameters (organ masses, volumes etc.); and automatic setting of system parameters (for example array RF coil selection).

This "multi-purpose" calibration scan according to the invention significantly simplifies, improves and accelerates the workflow for acquiring diagnostic MR images.

Since the calibration signal data set is acquired in accordance with the invention by means of a multi-point Dixon technique, a water map, a fat map and a $B_0$ map can be reconstructed from the calibration data. These maps are then used for a (preferably automated) segmentation of the water image and the fat image in order to obtain a water region and a fat region. The water region and the fat region are regions within the field of view that contain mainly water and fat tissue respectively. On this basis it is possible to determine shim settings that maximize the $B_0$ homogeneity (i.e. minimize the $B_0$ deviations) either in the water region or in the fat region. It is also possible to determine the shim settings in such a manner that a compromise is found that provides a decent $B_0$ homogeneity in both the water region and the fat region.

According to yet another preferred embodiment of the method of the invention, the shim settings are computed by optimizing a cost function depending on the $B_0$ deviation within the water region and the fat region. A minimization algorithm can be used to minimize an appropriately set up cost function. Therein the algorithm minimizes the deviation of $B_0$ in the water region, while simultaneously minimizing the number of voxels within the fat region which deviate more than a given offset value, for example 160 Hz, from the MR resonance frequency. A weighting factor can be applied for differently weighting the water region and the fat region in the cost function. The weighting factor can be selected such that the fat signal within the fat region is sufficiently well suppressed in the final diagnostic image (which is acquired by using frequency selective fat saturation), while the $B_0$ homogeneity within the water region is sufficiently homogeneous for delivering a diagnostic image of good quality. The parameters resulting from the minimization algorithm can then directly be translated into shim settings for energizing the shimming coils of the MR device.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, a reconstruction unit, and a visualization unit. The method of the invention is implemented by a corresponding programming of the reconstruction unit, the visualization unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
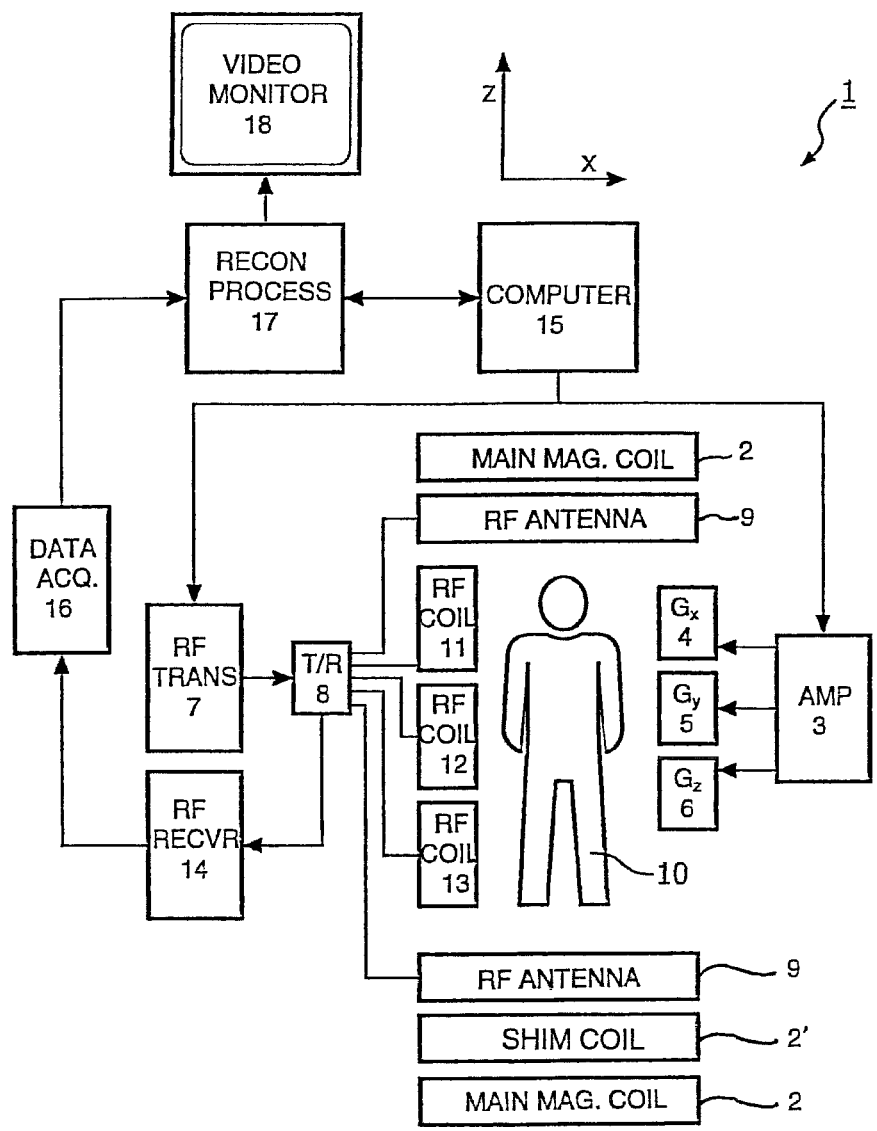
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a-body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
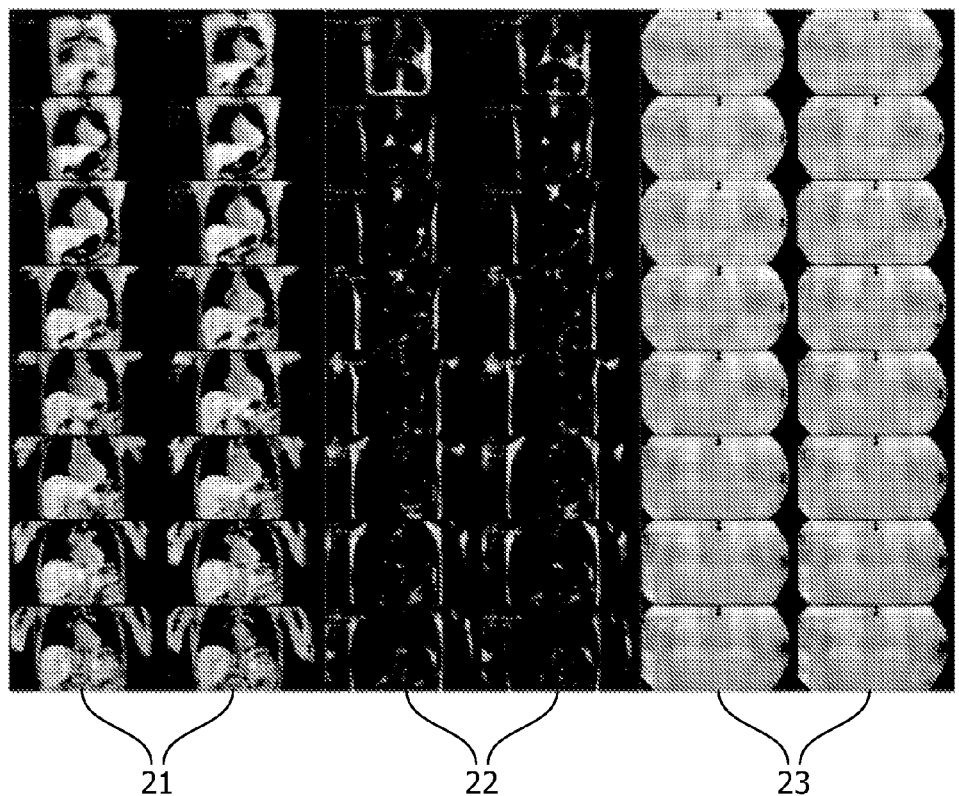
FIG. 2 shows low-resolution MR images reconstructed from calibration signal data according to the invention.

A first practical embodiment of the method of the invention is described as follows: After positioning the patient 10 in the iso-centre of the main magnet coil 2, a calibration sequence is started as a three-dimensional SENSE reference scan. The calibration scan uses several signal averages performed sequentially in time and is designed in the conventional way with interleaving signal acquisition via the body RF coil 9 and the array RF coils 11, 12, 13 using a Fast Field Echo (FFE) sequence. This sequence is modified into a multi-echo gradient echo sequence generating two or three gradient echoes after one excitation RF pulse, thereby facilitating chemical shift encoding. The calibration sequence is applied at a low image resolution such that the whole calibration scan can be performed within a couple of seconds. The acquired calibration signal data can then be reconstructed immediately into corresponding low-resolution images involving a water/fat separation step according to the per se known multi-point Dixon technique. The resulting images are shown in FIG. 2. FIG. 2 shows the images reconstructed after the water/fat resolved SENSE calibration scan according to the invention. The reconstructed calibration images include water images 21, fat images 22, and $B_0$ maps 23. Only a subset of the complete calibration data is shown in FIG. 2. In the practical embodiment, 64 slices are acquired with a voxel volume of 8×8×12 mm³. A 3-point Dixon technique is applied. The repetition time is 3.5 ms. The low-resolution images reconstructed from the calibration signal data set are transferred to image processing while the acquisition of the next three-dimensional block of calibration signal data is acquired to improve the signal-to-noise ratio or to acquire a different motion state. During image processing preferably the calibration image data acquired via the body RF coil 9 is analyzed by using an appropriate body model in order to derive patient positioning information. This analysis can be used to verify the correct positioning of the patient 10 within the examination volume. If the position of the patient 10 is not correct, a corresponding z-displacement can be determined automatically and can be used to move the patient 10 into the optimal position. A conventional motor-driven patient support (not depicted) can be used for this purpose. After the new position is reached, the three-dimensional calibration sequence can be restarted. When the patient 10 is in the correct position, low-resolution images are again reconstructed from the newly acquired calibration signal data set. The respective low-resolution images are then used to coarsely plan the forthcoming diagnostic scan. To this end appropriate body and organ models can be used, wherein benefit is taken from the complementary information reflected by the water and fat images obtained by means of the Dixon technique. Different anatomical structures can be identified automatically and their respective position can be determined. Additional information (such as organ masses, organ volumes, fat burden, etc.) can be extracted. The parameters of the diagnostic scan (stack/slice orientation, navigators etc.) can also be determined automatically on the basis of the determined organ positions. Moreover, it is possible to automatically decide on the array RF coils to be used to maximize the signal-to-noise ratio and to minimize the number of array RF coils required for the respective diagnostic task.

According to another practical embodiment, a similar three-dimensional SENSE calibration scan as the one described before is used in combination with a MR device comprising a dual channel transmit system (not depicted). Two separate transmit RF antennas are used for generating RF pulses within the examination volume. The transmit RF antennas have different spatial sensitivity profiles. A plurality of averages is used during the calibration scan. The acquired signal data of each average is evaluated separately. The first average is used to control the initial feet-head position of the patient 10 as described above. During the following calibration scans the calibration sequence is slightly modified by introducing additional RF pulses in order to provoke Bloch-Siegert-shift effects. These result in the strength of the transmit field ($B_1$) being encoded into the phases of the acquired MR signals. By comparison with the signal phases of the calibration signals acquired during the previous calibration scans, the amplitude of the corresponding transmit field $B_1$ can be estimated. Hence, the transmit sensitivities of the transmit RF coils connected to the two transmit channels of the system can be determined.

As a summary, the afore described practical embodiments of the invention allow to measure the local $B_0$ homogeneity, since the multi-point Dixon sequence automatically delivers a $B_0$ map. This can be used for shimming accordingly. Moreover, the spatial sensitivity profiles of the array RF coils can be determined, as in conventional SENSE imaging.

Further, the transmit sensitivities of the used transmit RF coils can be determined as well as further preparatory information (such as patient positioning, organ detection) can be obtained by means of a single calibration scan within short time.

Figure 3:
FIG. 3 shows water and fat regions in a MR image reconstructed from calibration signal data according to the invention.

According to yet another practical embodiment of the invention, again a $B_0$ map, a water image and a fat image is acquired by means of the calibration sequence at a low image resolution. An automated segmentation is then performed in order to identify regions containing water, regions containing fat tissue and regions containing both water and fat on the basis of the $B_0$ map, the water map, and the fat map as delivered by the multi-point Dixon technique. FIG. 3 shows the result of the segmentation. The water region is designated by reference number 31. The segment 32 represents subcutaneous fat. The region 33 represents a region containing a combination of water and internal fat. On the basis of this segmentation, the shim settings for the shimming coils 2' of the used MR device 1 are computed by optimizing a cost function depending on the $B_0$ deviation within the regions 31 and 32. It is postulated that in order for the "fat segment" 32 to be suppressed optimally by means of frequency-selective saturation, the number of voxels in the segment 31 with a frequency offset larger than 160 Hz needs to be minimized. It has to be noted that this is an asymmetric criterion since large negative frequency offsets are not relevant. For the "water segment" 31, it is assumed that shimming is sufficient if the number of pixels outside of a frequency offset interval of +−120 Hz is minimized. Both criteria are summed in order to form the cost function. The cost function is minimized by means of an appropriate algorithm. The resulting parameters are then used to derive the shim settings accordingly.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:
1. A method of magnetic resonance (MR) imaging of at least a portion of a body of a patient positioned in an examination volume of a MR device the method comprising:
  with a controller, controlling currents in RF coils and magnetic field gradient coils of the MR device in order to implement a multi-point Dixon imaging technique that generates first MR image data at a first image resolution;
  with one or more computer processors:
    reconstructing the first MR image data in order to generate a B0 field map, a water image, and a fat image at the first resolution,
    segmenting the water and fat images in order to identify a water region and a fat region,
    determining a $B_0$ homogeneity in the identified water region and a $B_0$ homogeneity in the identified fat region,
    determining shim settings utilized by shim coils of the MR device where the determined shim settings achieve at least one of:
      maximizing $B_0$ homogeneity in the identified water region,
      maximizing $B_0$ in the identified fat region, and
      improving $B_0$ homogeneity in both the identified water region and the identified fat region;

with the controller, implementing a diagnostic MR imaging sequence including:
controlling currents in the shim coils according to the determined shim settings, and controlling currents in the RF coils and the magnetic field gradient coils in order to generate diagnostic MR image data at a second image resolution which is higher than the first image resolution; and
with the one or more computer processors, reconstructing the generated diagnostic MR image data into a diagnostic MR image with the second image resolution.

2. The magnetic resonance imaging method of claim 1, wherein the diagnostic MR imaging sequence is a parallel MR imaging sequence producing MR image data that are received in parallel via a plurality of RF coils in an array of RF coils of the MR device, and wherein the RF coils of the array RF coils have different spatial sensitivity profiles.

3. The magnetic resonance imaging method of claim 2, further including:
with the one or more processors, determining the spatial sensitivity profiles of the RF coils in the array of RF coils from the first MR image data and reconstructing the diagnostic MR image using the determined spatial sensitivity profiles of the array RF coils.

4. The magnetic resonance imaging method of claim 1, comprising with one or more computer processors performing at least one of:
scan planning based on at least one of the water and fat images,
patient anatomy identification planning based on at least one of the water and fat images,
automated patient repositioning based on at least one of the reconstructed water and fat images, and
fitting of a body model to at least one of the reconstructed water and fat images.

5. The magnetic resonance imaging method of claim 1, further comprising with the one or more computer processors:
analyzing at least one of the water and fat images in order to derive patient positioning information;
determining a positioning of the patient in the examination volume based on the derived patient positioning information; and
driving the magnetic resonance imaging device in order to move the patient into a desired position in the examination volume when the determined positioning of the patient is different from the desired position.

6. The magnetic resonance imaging method of claim 1, wherein the determined shim settings utilized by the shimming coils are determined by optimizing a cost function depending on B0 homogeneity deviation occurring within the identified water region and the identified fat region,
wherein the act of optimizing the cost function comprises:
suppressing the identified fat region by minimizing a number of voxels in the fat region having a frequency offset larger than 160 Hz; and
adjusting the determined shim settings until a number of pixels of the identified water region, that occur outside of a frequency offset interval of ±120 Hz is minimized.

7. A magnetic resonance (MR) device comprising:
at least one main magnet coil configured to generate a uniform, steady magnetic field B0 within an examination volume;
a plurality of gradient coils configured to generate switched magnetic field gradients in different spatial directions within the examination volume;
at least one body RF coil configured to functionally perform at least one of:
generating RF pulses within the examination volume and
receiving MR signals from a body of a patient positioned in the examination volume;
shim coils configured to shim the uniform, steady magnetic field $B_0$;
a controller configured to control the gradient coils and the at least one body RF coil in order to implement a multi-point Dixon imaging technique that generates calibration data at a first image resolution;
one or more computer processors configured to:
reconstruct the generated calibration data in order to reconstruct a B0 field map, a water image, and a fat image at the first resolution,
segment the reconstructed water and fat images in order to identify a water region and a fat region,
determine a $B_0$ homogeneity in the identified water region and in the identified fat region,
determine shim settings utilized by shim coils of the MR device where the determined shim settings achieve at least one of:
maximizing $B_0$ homogeneity in the identified water region,
maximizing $B_0$ in identified the fat region, and
improving $B_0$ homogeneity in both the identified water region and the identified fat region;
wherein the controller is further configured in order to implement a diagnostic MR imaging scan including:
controlling currents in the shim coils according to the determined shim settings and
controlling currents in the RF coils and the gradient magnetic field coils in order to generate diagnostic MR image data at a second resolution which is higher than the first resolution; and
wherein the one or more computer processors are further configured to:
reconstruct the diagnostic MR image data into a diagnostic MR image with the second resolution.

8. The magnetic resonance imaging method of claim 1, wherein the diagnostic MR imaging scan sequence is a parallel imaging sequence and the at least one RF coil includes an array of RF coils, the array of RF coils being configured to receive the diagnostic MR image data in parallel, the RF coils in the array RF coils having different spatial sensitivity profiles, wherein the one or more computer processors are further configured to derive the spatial sensitivity profiles of the RF coils in the array RF coils as calibration parameters from the first MR image data, and to reconstruct the diagnostic MR image from a combination of the generated diagnostic MR image data and the spatial sensitivity profiles of the array RF coils.

9. The MR apparatus of claim 7, wherein the one or more computer processors are further configured to determine an MR frequency from the generated calibration data that is utilized in implementing the diagnostic MR imaging scan.

10. A non-transitory computer readable medium embodying computer instructions which, when executed by a processor, configure the processor to perform on a magnetic resonance imaging device the magnetic resonance imaging method of:
controlling currents in RF coils and magnetic field gradient coils of the MR device in order to implement a multi-point Dixon imaging technique that generates first MR image data at a first image resolution;

reconstructing the first MR image data in order to reconstruct a $B_0$ field map, a water image, and a fat image at the first resolution, segmenting the water and fat images in order to identify a water region and a fat region, determining a $B_0$ homogeneity in the identified water region and a $B_0$ homogeneity in the identified fat region, determining shim settings utilized by shim coils of the MR device where the determined shim settings achieve at least one of:
  maximizing $B_0$ homogeneity in the identified water region,
  maximizing $B_0$ in the identified fat region, and
  improving $B_0$ homogeneity in both the identified water region and the identified fat region;

controlling currents in the shim coils according to the determined shim settings, and controlling currents in the RF coils and the magnetic field gradient coils in order to generate diagnostic MR image data at a second image resolution which is higher than the first image resolution; and reconstructing the generated diagnostic MR image data into a diagnostic MR image with the second image resolution.

11. The MR device of claim 7, wherein the one or more computer processors are configured to determine the shim settings that maximize the $B_0$ homogeneity in the identified water region.

12. The MR device of claim 7, wherein the one or more computer processors are configured to determine the shim settings by optimizing a cost function based on a B0 homogeneity deviation occurring in the identified water region and the identified fat region.

13. The MR device of claim 12, wherein the one or more computer processors are configured to optimize the cost function by:
  suppressing the identified fat region by minimizing a number of voxels in the identified fat region having a frequency offset larger than 160 Hz; and
  adjusting the determined shim settings until a number of pixels of the identified water region, that occur outside of a frequency offset interval of ±120 Hz, is minimized.

14. The MR device of claim 7, wherein the multi-point Dixon technique is selected from a three-point Dixon imaging technique or a four-point Dixon imaging technique.

* * * * *